United States Patent
Sander et al.

(10) Patent No.: US 10,468,405 B2
(45) Date of Patent: Nov. 5, 2019

(54) ELECTRIC CIRCUIT INCLUDING A SEMICONDUCTOR DEVICE WITH A FIRST TRANSISTOR, A SECOND TRANSISTOR AND A CONTROL CIRCUIT

(71) Applicant: Infineon Technologies AG, Neubiberg (DE)

(72) Inventors: Rainald Sander, Oberhaching (DE); Till Schloesser, Munich (DE)

(73) Assignee: Infineon Technologies AG, Neubiberg (DE)

( * ) Notice: Subject to any disclaimer, the term of this patent is extended or adjusted under 35 U.S.C. 154(b) by 212 days.

(21) Appl. No.: 15/418,491

(22) Filed: Jan. 27, 2017

(65) Prior Publication Data
US 2017/0221885 A1    Aug. 3, 2017

(30) Foreign Application Priority Data

Jan. 29, 2016   (DE) ........................ 10 2016 101 676

(51) Int. Cl.
*H01L 29/40*    (2006.01)
*H01L 29/78*    (2006.01)
(Continued)

(52) U.S. Cl.
CPC ............ *H01L 27/088* (2013.01); *H01L 27/06* (2013.01); *H01L 29/0623* (2013.01);
(Continued)

(58) Field of Classification Search
CPC ... H01L 27/088; H01L 27/06; H01L 29/0623; H01L 29/0696; H01L 29/0865
(Continued)

(56) References Cited

U.S. PATENT DOCUMENTS 6,072,676 A  *  6/2000  Tran ................... H01L 27/0248
                                                 323/284
6,269,014 B1    7/2001  Sander et al.
(Continued)

FOREIGN PATENT DOCUMENTS

DE        19935100 A1     3/2001
DE     102013113284 A1    6/2014
(Continued)

*Primary Examiner* — Dinh T Le
(74) *Attorney, Agent, or Firm* — Murphy, Bilak & Homiller, PLLC

(57) ABSTRACT

An electric circuit includes a semiconductor device. The semiconductor device includes a first transistor and a second transistor in a common semiconductor substrate. The first transistor is of the same conductivity type as the second transistor. A first source region of the first transistor is electrically connected to a first source terminal via a first main surface of the semiconductor substrate. A second drain region of the second transistor is electrically connected to a second drain terminal via a first main surface of the semiconductor substrate. A first drain region of the first transistor and a second source region of the second transistor are electrically connected to an output terminal via a second main surface of the semiconductor substrate. The electric circuit further includes a control circuit operable to control a first gate electrode of the first transistor and a second gate electrode of the second transistor.

22 Claims, 11 Drawing Sheets

(51) Int. Cl.
*H01L 27/088* (2006.01)
*H01L 29/06* (2006.01)
*H01L 29/08* (2006.01)
*H01L 29/10* (2006.01)
*H01L 29/417* (2006.01)
*H03K 17/687* (2006.01)
*H01L 27/06* (2006.01)

(52) U.S. Cl.
CPC ...... *H01L 29/0696* (2013.01); *H01L 29/0865* (2013.01); *H01L 29/0882* (2013.01); *H01L 29/1087* (2013.01); *H01L 29/1095* (2013.01); *H01L 29/404* (2013.01); *H01L 29/4175* (2013.01); *H01L 29/78* (2013.01); *H01L 29/7816* (2013.01); *H03K 17/6871* (2013.01)

(58) Field of Classification Search
USPC .......................................................... 327/108
See application file for complete search history.

(56) References Cited

U.S. PATENT DOCUMENTS

| | | | | |
|---|---|---|---|---|
| 7,675,724 | B2* | 3/2010 | Ker | H01L 27/0266 361/111 |
| 8,072,189 | B2* | 12/2011 | Sakurai | H02J 7/0034 320/134 |
| 8,310,007 | B2* | 11/2012 | Darwish | H01L 21/823418 257/341 |
| 9,087,829 | B2 | 7/2015 | Macheiner et al. | |
| 2012/0274366 | A1* | 11/2012 | Briere | H01L 21/8258 327/108 |
| 2015/0137224 | A1 | 5/2015 | Meiser et al. | |

FOREIGN PATENT DOCUMENTS

| | | |
|---|---|---|
| DE | 102015119771 A1 | 5/2017 |
| WO | 2014086479 A1 | 6/2014 |

\* cited by examiner

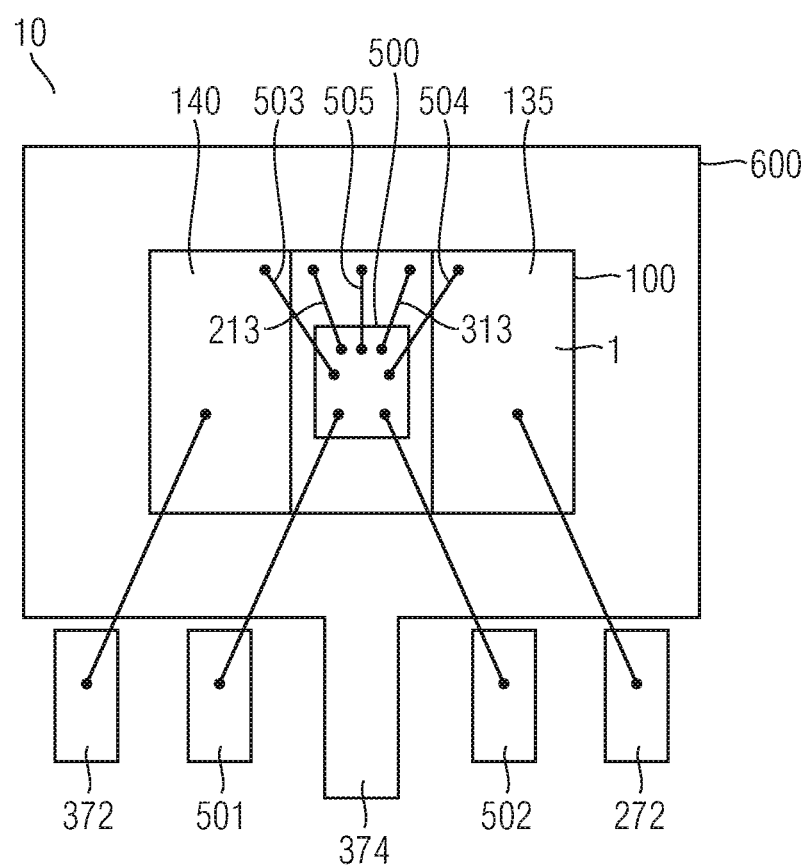

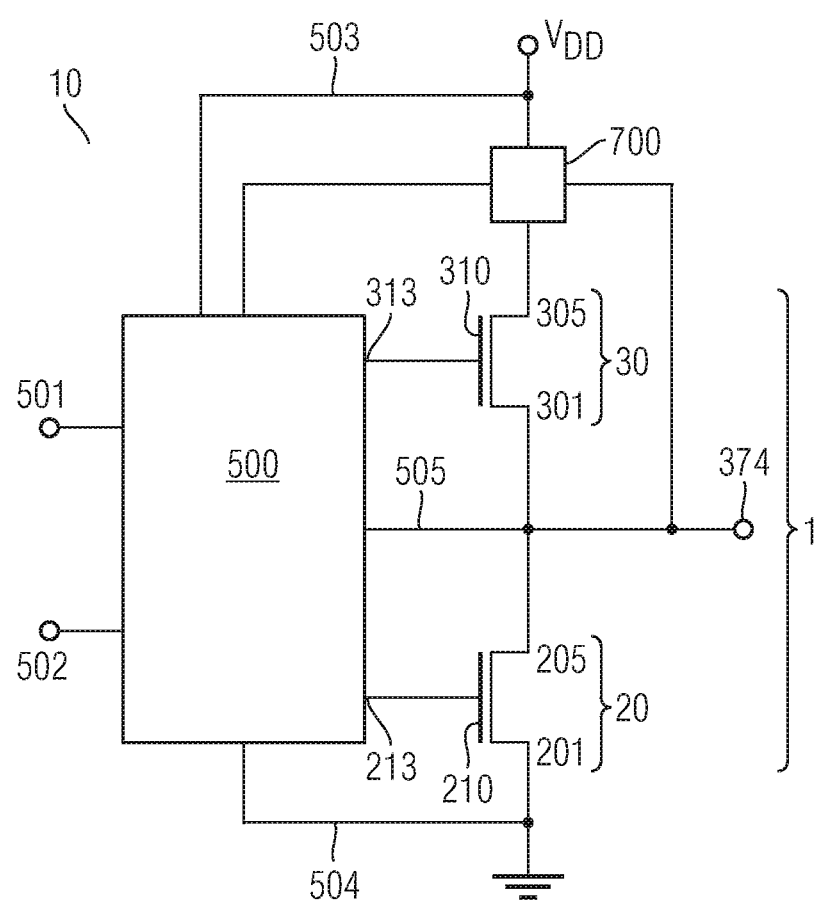

ELECTRIC CIRCUIT INCLUDING A SEMICONDUCTOR DEVICE WITH A FIRST TRANSISTOR, A SECOND TRANSISTOR AND A CONTROL CIRCUIT

BACKGROUND

Semiconductor devices comprising transistors which are suitably connected to form half-bridges are commonly used in the field of power electronics. For example, half-bridges may be used for driving electro motors or switched mode power supplies.

Improved concepts for semiconductor devices comprising two transistors formed in one semiconductor substrate are being developed.

SUMMARY

According to an embodiment, an electric circuit includes a semiconductor device. The semiconductor device comprises a first transistor and a second transistor in a common semiconductor substrate, the first transistor being of the same conductivity type as the second transistor. A first source region of the first transistor is electrically connected to a first source terminal via a first main surface of the semiconductor substrate. A second drain region of the second transistor is electrically connected to a second drain terminal via a first main surface of the semiconductor substrate, and a first drain region of the first transistor and a second source region of the second transistor being electrically connected to an output terminal via a second main surface of the semiconductor substrate. The electric circuit further including a control circuit operable to control a first gate electrode of the first transistor and a second gate electrode of the second transistor.

According to a further embodiment, an electric circuit includes a semiconductor device. The semiconductor device comprising a first transistor and a second transistor in a common semiconductor substrate having a first main surface, the first and the second transistors being of the same conductivity type. The first transistor comprises a first source region adjacent to the first main surface, and a first drain contact portion electrically connected to a first drain region. The second transistor comprises a second drain region adjacent to the first main surface, and a first source contact portion electrically connected to a second source region. The semiconductor substrate further comprises a first semiconductor layer of a first conductivity type, the first drain contact portion and the first source contact portion being electrically connected to the first semiconductor layer, and a buried layer of a second conductivity type between the first transistor and the first semiconductor layer. The buried layer is absent from a region between the first semiconductor layer and the second transistor. Alternatively, the semiconductor substrate further comprises a buried layer of the second conductivity type between the first semiconductor layer and the second transistor, wherein the buried layer is absent from a region between the first semiconductor layer and the first transistor. The electric circuit further comprises a control circuit operable to control a first gate electrode of the first transistor and a second gate electrode of the second transistor.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of embodiments of the invention and are incorporated in and constitute a part of this specification. The drawings illustrate the embodiments of the present invention and together with the description serve to explain the principles. Other embodiments of the invention and many of the intended advantages will be readily appreciated, as they become better understood by reference to the following detailed description. The elements of the drawings are not necessarily to scale relative to each other. Like reference numbers designate corresponding similar parts.

FIG. 2 shows a schematic plan view of a semiconductor device according to an embodiment.

FIG. 3 shows an equivalent circuit diagram of a semiconductor device according to a further embodiment.

DETAILED DESCRIPTION

Figure 1A:
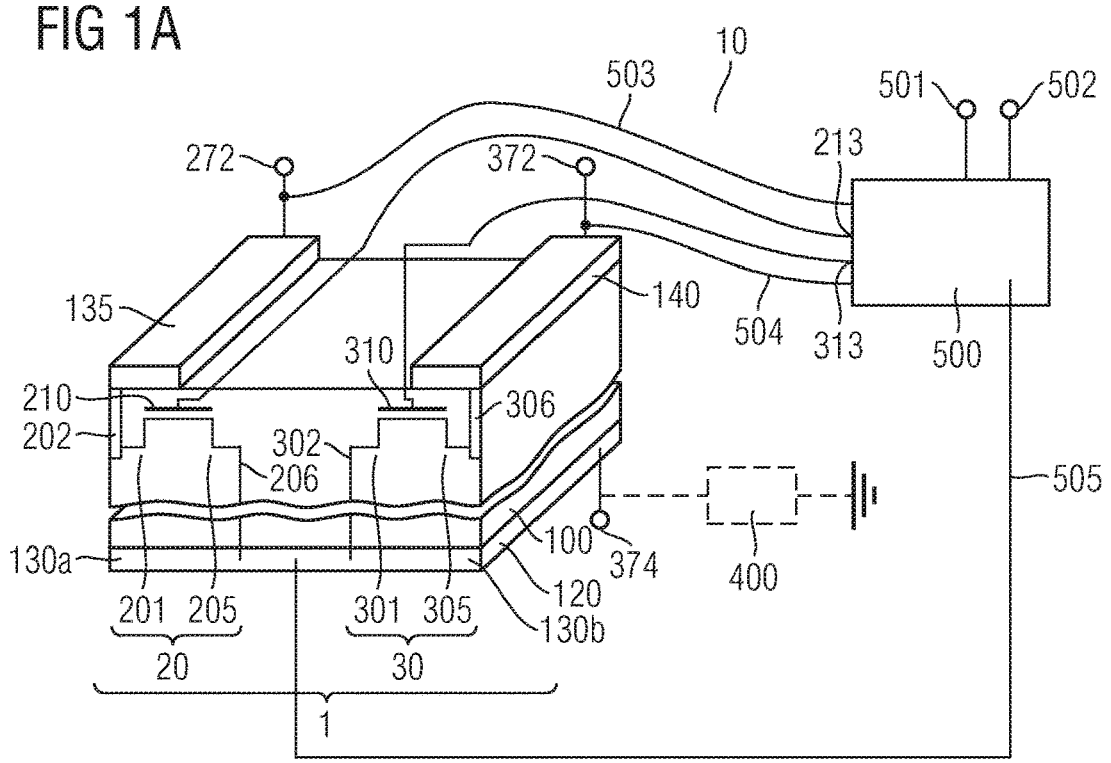
FIG. 1A shows a schematic perspective view of a semiconductor device according to an embodiment.

In the following detailed description reference is made to the accompanying drawings, which form a part hereof and in which are illustrated by way of illustration specific embodiments in which the invention may be practiced. In this regard, directional terminology such as "top", "bottom", "front", "back", "leading", "trailing" etc. is used with reference to the orientation of the Figures being described. Since components of embodiments of the invention can be positioned in a number of different orientations, the directional terminology is used for purposes of illustration and is in no way limiting. It is to be understood that other embodiments may be utilized and structural or logical changes may be made without departing from the scope defined by the claims.

The description of the embodiments is not limiting. In particular, elements of the embodiments described hereinafter may be combined with elements of different embodiments.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

As employed in this specification, the terms "coupled" and/or "electrically coupled" are not meant to mean that the elements must be directly coupled together—intervening elements may be provided between the "coupled" or "electrically coupled" elements. The term "electrically connected" intends to describe a low-ohmic electric connection between the elements electrically connected together.

The Figures and the description illustrate relative doping concentrations by indicating "−" or "+" next to the doping type "n" or "p". For example, "n$^{-}$" means a doping concentration which is lower than the doping concentration of an "n"-doping region while an "n⁺"-doping region has a higher doping concentration than an "n"-doping region. Doping regions of the same relative doping concentration do not necessarily have the same absolute doping concentration. For example, two different "n"-doping regions may have the same or different absolute doping concentrations. In the Figures and the description, for the sake of a better comprehension, often the doped portions are designated as being "p" or "n"-doped. As is clearly to be understood, this designation is by no means intended to be limiting. The doping type can be arbitrary as long as the described functionality is achieved. Further, in all embodiments, the doping types can be reversed.

The present specification refers to a "first" and a "second" conductivity type of dopants, semiconductor portions are doped with. The first conductivity type may be p type and the second conductivity type may be n type or vice versa. As is generally known, depending on the doping type or the polarity of the source and drain regions, insulated gate field effect transistors (IGFETs) such as metal oxide semiconductor field effect transistors (MOSFETs) may be n-channel or p-channel MOSFETs. For example, in an n-channel MOSFET, the source and the drain region are doped with n-type dopants. In a p-channel MOSFET, the source and the drain region are doped with p-type dopants. As is to be clearly understood, within the context of the present specification, the doping types may be reversed. If a specific current path is described using directional language, this description is to be merely understood to indicate the path and not the polarity of the current flow, i.e. whether the current flows from source to drain or vice versa. The Figures may include polarity-sensitive components, e.g. diodes. As is to be clearly understood, the specific arrangement of these polarity-sensitive components is given as an example and may be inverted in order to achieve the described functionality, depending whether the first conductivity type means n-type or p-type.

The terms "lateral" and "horizontal" as used in this specification intends to describe an orientation parallel to a first surface of a semiconductor substrate or semiconductor body. This can be for instance the surface of a wafer or a die.

The term "vertical" as used in this specification intends to describe an orientation which is arranged perpendicular to the first surface of the semiconductor substrate or semiconductor body. Throughout the present specification elements of field effect transistors are described. Generally, a field effect transistor comprises a plurality of transistor cells that are connected in parallel. For example, as will be discussed in the following, each single transistor cell comprises a single gate electrode, a body region and further components. The gate electrodes of the single transistor cells may be connected to a common terminal, e.g. a gate terminal. Further components of the single transistor cells, e.g. source regions, drain regions may be respectively connected to a common source terminal, a common drain terminal etc. The following description specifically describes the structure of the single transistor cells while generally referring to a transistor. However, as is to be clearly understood the single transistor cells are connected with a plurality of further transistor cells so as to form the respective transistor. Some of the components of the transistor cells such as the body regions may be formed separately from each other. Other components of the transistor cells such as the drain regions may be formed jointly for all of the transistor cells connected in parallel. FIG. 1A shows a schematic perspective view of an electric circuit 10 including a semiconductor device 1 according to an embodiment. The electric circuit 10 includes a semiconductor device 1 comprising a first transistor 20 and a second transistor 30 that are formed in a semiconductor substrate 100. The first transistor 20 and the second transistor 30 implement power transistors. The first transistor 20 is of the same conductivity type as the second transistor 30. For example, the first transistor and the second transistor may be of n-type conductivity type. According to a further embodiment, the first transistor 20 and the second transistor 30 may be of p-type conductivity.

The first transistor 20 comprises a first source region 201 which is electrically connected to a first source terminal 272 via a first main surface 110 of the semiconductor substrate 100. Moreover, a second drain region 305 of the second transistor 30 is electrically connected to a second drain terminal 372 via the first main surface 110 of the semiconductor substrate 100. A first drain region 205 of the first transistor 20 and a second source region 301 of the second transistor 30 are electrically connected to an output terminal 374 via a second main surface 120 of the semiconductor substrate 100. The electric circuit 10 further comprises a control circuit 500 for controlling a first gate electrode 210 of the first transistor 20 and a second gate electrode 310 of the second transistor 30.

The first transistor 20 and the second transistor 30 are disposed in a common or single semiconductor substrate. Accordingly, as is illustrated in FIG. 1A, components of the first transistor 20 and the second transistor 30 are arranged in a single semiconductor substrate. As is clearly to be understood, the semiconductor substrate may comprise several layers, e.g. of different conductivity types and which may have been formed by successive processing steps in the manner as has been explained above.

The second main surface 120 of the semiconductor substrate is on a side opposite to the first main surface 110. Accordingly, the semiconductor device 1 comprising a first transistor 20 and the second transistor 30 may be contacted from opposing sides of the semiconductor substrate 100. The first transistor 20 comprises a first gate electrode 210, and the second transistor 30 comprises a second gate electrode 310.

The control circuit 500 is configured to correspondingly drive the first gate terminal 213 and the second gate terminal 313, thereby controlling the switching of the first and second transistors 20, 30, respectively. Digital signals from a first input terminal 501 and a second input terminal 502 are input into the control circuit 500, e.g. as digital signals. The signals fed to the first gate electrode 210 and the second gate electrode 310 are generated by appropriately processing the input signals IN1, IN2 input from the first input terminal 501 and the second input terminal 502, respectively.

The first source region is connected to a first source terminal 272, which may be held at ground potential (GND). The second drain region 305 is electrically connected to a second drain terminal 372 which may be electrically connected to a supply voltage. The control circuit 500 may be electrically connected to the second drain terminal 372 by a first connection line 504. Further, the control circuit 500 may also be electrically connected to the first source terminal 272 by means of a second connection line 503. A signal corresponding to a potential at the second source region 301 may be supplied to the control circuit 500 via a source contact line 505. The source contact line 505 may implement a low-current or current-less electrical contact between the second source region 301 and the control circuit 500. The signal corresponding to the potential at the second source region 301 may be used as a reference voltage for setting the gate voltage at the second gate electrode 310, e.g. via the second gate terminal 313. For example, a signal supplied via the second connection line 503 may be used as a further reference voltage for setting the gate voltage at the first gate electrode 210, e.g. via the first gate terminal 213.

The output voltage may be output via the output terminal 374. For example, a load 400 may be electrically connected to the output terminal 374. The control circuit 500 may further comprise sensors for measuring a temperature, a voltage or a current of the electric circuit 10. For example, an overcurrent, an overtemperature or an overvoltage may be determined so that the electric circuit 10 may be switched off. According to further embodiments, these sensors may be disposed in the semiconductor device 1 and may transmit corresponding signals to the control circuit 500 which then appropriately controls the transistors 20, 30.

Due to the feature that the first transistor 20 and the second transistor 30 are arranged in a single semiconductor substrate 100, the control circuit 500 and the semiconductor device 1 may be assembled in a simplified manner. For example, the control circuit 500 may be disposed on top of the semiconductor substrate 100. Further, due to the fact that the output terminal is disposed adjacent to a second main surface of the semiconductor substrate, whereas the first source terminal and the second drain terminal are contacted via the first main surface 110, the first source terminal 272 and the second drain terminal 372 as well as the output terminal 374 may be contacted in a simplified manner.

According to an embodiment, the first drain region, the first source region, the second source region and the second drain region may be disposed adjacent to the first main surface of the semiconductor substrate. Further, the first transistor may comprise a first body region and a first drift zone which may be arranged in a first direction parallel to the first main surface. Moreover, the second transistor may comprise a second body region and a second drift zone which are arranged in a first direction parallel to the first main surface. Accordingly, the first transistor 20 and the second transistor 30 may be implemented as lateral transistors. Further details of the first transistor 20 and the second transistor 30 will be explained below with reference to FIGS. 4 to 6B.

Figure 1B:
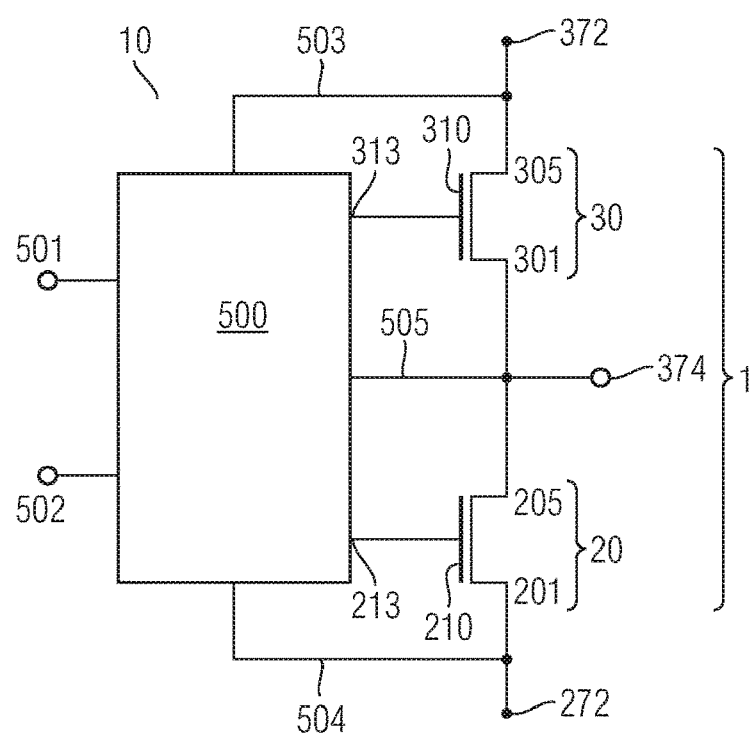
FIG. 1B shows an equivalent circuit diagram of a semiconductor device according to an embodiment.

FIG. 1B shows an equivalent circuit diagram of the electric circuit shown in FIG. 1A. The first transistor 20 and the second transistor 30 are connected in series with the first drain region 205 being connected to the second source region 301 and being connected to an output terminal 374. The control circuit 500 comprises a first gate terminal 213 and a second gate terminal 313 which control the gate voltage applied to the first gate electrode 210 and the second gate electrode 310, respectively. The first source terminal 272 is electrically connected to the first source region 201 and further to the control circuit 500. Moreover, the second drain terminal 372 is electrically connected to the control circuit 500. The second drain region 301 is electrically connected to the control circuit vial a source contact line 505. The control circuit 500 receives input signal IN1, IN2 from a first input terminal 501 and a second input terminal 502, respectively. The configuration shown in FIG. 1B implements a half-bridge, in which the first transistor 20 implements a low-side switch, and the second transistor 30 implements a high-side switch.

The output terminal 374 may be also referred to as a "phase terminal". The second drain region 305 may be connected to a drain terminal 372 which may be held at a supply potential. The first source region 201 may be connected to a source terminal 272 which may be ground. Further, a second gate voltage may be applied to the second gate electrode 310 via a second gate terminal 313. For example, the output terminal 374 may be connected to a load 400 such as a motor. In this configuration, the motor may be provided with forward and backward current. Accordingly, the circuit shown in FIGS. 1A and 1B includes a semiconductor device comprising an integrally formed half-bridge switch. The electric circuit may be used in a DC/DC converter, e.g. a buck or a boost converter. Moreover, the half bridge may be used in a switched mode power supply. An electric device further comprising a load as shown in FIG. 1A may implement, e.g. a DC/DC converter, a power supply or a motor drive.

FIG. 2 shows an example of an arrangement of the electric circuit 10 which has been shown in FIGS. 1A and 1B, for example. A semiconductor device 1 comprising a first transistor 20 and a second transistor 30 which are disposed in a single semiconductor substrate 100 may be arranged on a suitable carrier 600. Further, the control circuit 500 may be arranged over the semiconductor substrate 100. Due to the specific structure of the semiconductor device 1, the control circuit 500 may be mounted in an easy and cheap manner on the semiconductor device 1. Further, due to the specific arrangement of first transistor and second transistor, there is sufficient space on the first main surface 110 of the semiconductor substrate 100 to place the control circuit 500. The carrier 600 may comprise a conductive material so as to electrically contact the conductive layer 130 forming the second drain contact portion 130a and the second source contact portion 130b. The control circuit 500 may be placed between the first front side conductive layer 135 and the second front side conductive layer 140. Terminals of the control circuit may be connected to the first input terminal 501 and the second input terminal 502. Further, the first front side conductive layer 135 may be electrically connected to the first source terminal 272. The second front side conductive layer 140 may be electrically connected to the second drain terminal 372. The control circuit 500 may further be connected to the second source region 301 via the source contact line 505.

According to further embodiments, the control circuit may be mounted separately from the semiconductor device 1 comprising the first transistor and the second transistor. Moreover, the control circuit 500 and the semiconductor device 1 may be arranged in a common housing. According to further embodiments 500, the control circuit may be implemented in a different manner. For example, any of the input terminals may be implemented in a different manner.

FIG. 3 shows a further embodiment of the electric circuit 10. In addition to the elements described hereinbefore, the electric circuit 10 shown in FIG. 3 further comprises a charge pump 700 which may be configured to increase a voltage applied to the second gate electrode 310 with respect to the supply voltage Vdd or the voltage applied to the second drain terminal 372. For example, this may be useful in a case in which the second transistor 30 is implemented as an n-type transistor. Due to the varying potential at the second source region 301, it may be necessary to apply a voltage higher than the supply voltage to the second gate electrode 310. This may be implemented by a charge pump 700. According to embodiments, the charge pump 700 may be implemented by a corresponding switching element which may comprise capacitors and diodes. According to a further embodiment, the charge pump 700 may be implemented as a bootstrap circuit. The charge pump 700 may be implemented in a conventionally known manner.

Figure 4:
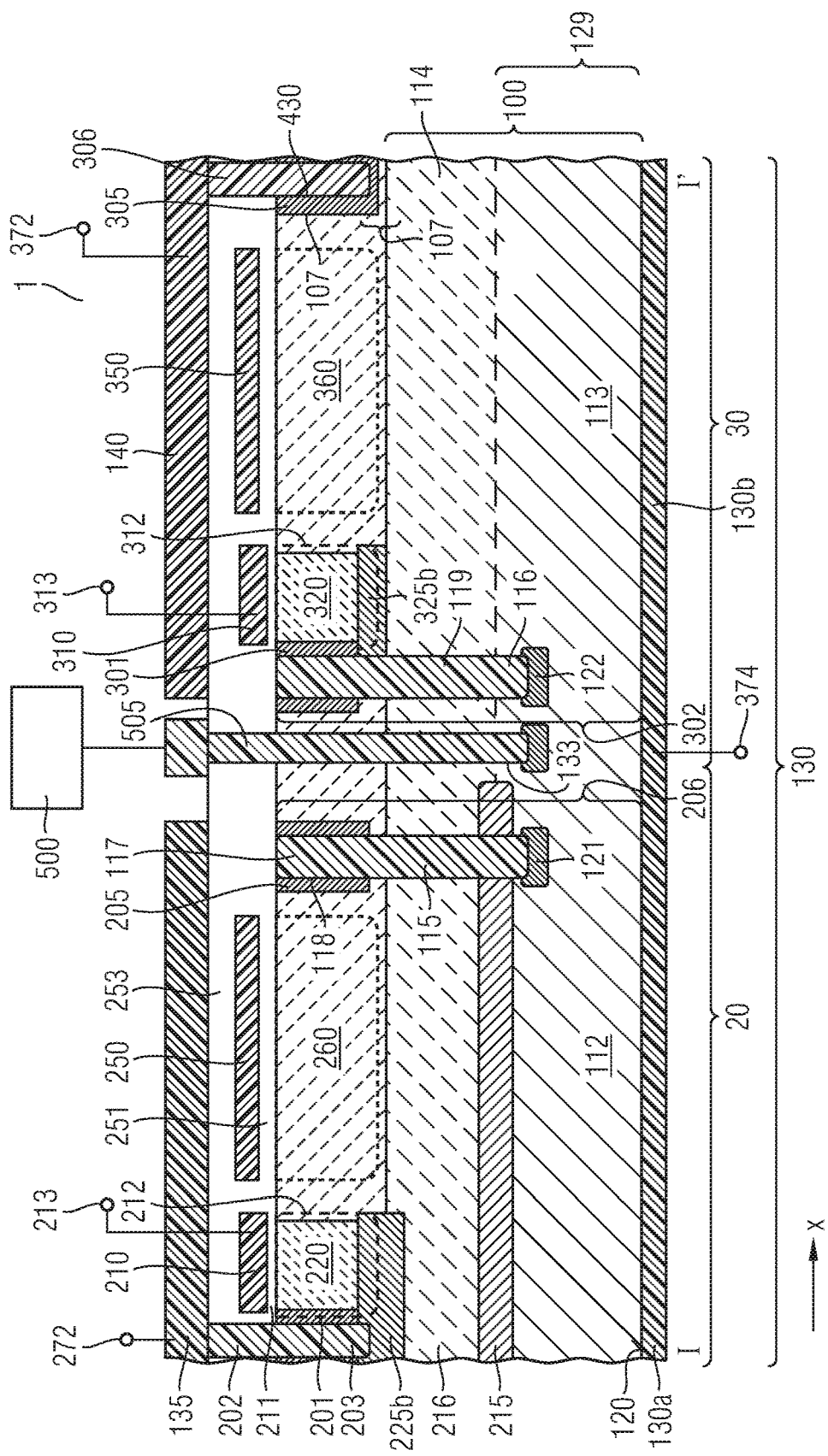
FIG. 4 shows a cross-sectional view of an example of the semiconductor device according to an embodiment.

FIG. 4 shows a cross-sectional view of a semiconductor device 1 which may form a component of the electric circuit 10 described above according to an embodiment. The semiconductor device 1 shown in FIG. 4 comprises a first transistor 20 and a second transistor 30. The first transistor 20 and the second transistor 30 are formed in a common semiconductor substrate 100 having a first main surface 110 and a second main surface 120. The first transistor 20 comprises a first source region 201, a first drain region 205, a first body region 220, and first drift zone 260. The first transistor 20 further comprises a first gate electrode 210 which may be disposed in a first gate trench 212 formed in the first main surface 110 adjacent to the first body region 220. The first gate electrode 210 is configured to control a conductivity of a channel in the first body region 220. A longitudinal axis of the first gate trench 212 may extend in a first direction that is parallel to the first main surface, e.g. the x direction. In FIG. 4, the first gate trench 212 is indicated by dotted lines and is disposed before or behind the depicted plane of the drawing. The first body region 220 and the first drift zone 260 may be disposed along the first direction between the first source region 201 and the first drain region 205. The first transistor 20 further comprises a first drain contact that is electrically connected to the first drain region 205. The first drain contact comprises a first drain contact portion 206 and a second drain contact portion 130a. The second drain contact portion 130a is disposed at the second main surface 120 of the semiconductor substrate 100. The first drain contact portion 206 comprises a drain conductive material 115 in direct contact with the first drain region 205, the first drain contact portion 206 further comprises a first portion 112 of the semiconductor substrate arranged between the drain conductive material 115 and the second drain contact portion 130a.

The second transistor 30 comprises a second source region 301, a second drain region 305, a second body region 320 and a second drift zone 360. The second transistor 30 further comprises a second gate electrode 310 and a second gate trench 312 in the first main surface 110 adjacent to the second body region 320. The second gate electrode 310 is configured to control a conductivity of a channel in the second body region 320. A longitudinal axis of the second gate trench 312 may extend in a direction parallel to the first main surface of the semiconductor substrate, e.g. in the first direction. The second body region 320 and the second drift zone 360 may be disposed along the first direction between the second source region 301 and the second drain region 305. The second transistor 30 further comprises a second source contact electrically connected to the second source region 301. The second source contact comprises a first source contact portion 302 and a second source contact portion 130b. The second source contact portion 130b is disposed at the second main surface 120 of the semiconductor substrate 100. The first source contact portion 302 comprises a source conductive material 116 in direct contact with the second source region 301, the first source contact portion 302 further comprises a second portion 113 of the semiconductor substrate 100 arranged between the source conductive material 116 and the second source contact portion 130b.

The second transistor 30 may have a similar construction as the first transistor 20, with the exception that the second drain contact of the second transistor is implemented in a different manner. Further, the second source contact is implemented in a different manner so that the second source contact electrically connects the second source region 301 with the conductive layer (back side metallization layer) 130 disposed at the second main surface 120 of the semiconductor substrate. The first transistor 20 and the second transistor 30 are of the same conductivity type, for example having e.g. an n-type channel. Accordingly, the first body region 220 and the second body region 320 are of the same conductivity type, e.g. p-type.

According to the configuration shown in FIG. 4, the first portion 112 of the semiconductor substrate 100 and the second portion 113 of the semiconductor substrate form part of a first layer 129 adjacent to the second main surface 120. The first layer 129 electrically contacts a conductive layer 130 at the back side (second main surface) 120 of the semiconductor substrate. The first drain contact of the first transistor 20 may extend from the first drain region 205 into the semiconductor substrate 100 and may comprise a portion of the first layer 129. Likewise, the second source contact may extend from the second source region 301 into the semiconductor substrate 100 and may comprise a portion of the first layer 129. A common output terminal 374 may be electrically connected with the conductive layer 130 which is disposed adjacent to the second main surface 120 of the semiconductor substrate. Accordingly, the first drain region 205 and the second source region 301 are electrically connected to an output terminal 374.

The first source region 201 is electrically connected via the first source contact 202 with a first source terminal 272. A first front side conductive layer 135 may be disposed adjacent to a first main surface 110 of the semiconductor substrate and may be electrically connected via the first source contact 202 to the first source region 201 of the first transistor 20. A second front side conductive layer 140 may be disposed adjacent to the first main surface 110 of the semiconductor substrate and may be electrically connected via the second drain contact 306 to the second drain region 305 of the second transistor 30. Accordingly, the semiconductor device illustrated in FIG. 4 implements a vertical semiconductor device and may be contacted from opposing sides of the semiconductor substrate 100. The first front side conductive layer 135 and the second front side conductive layer 140 may be implemented by metallization layers.

As is further illustrated in FIG. 4, according to an embodiment, the source contact line 505 may be implemented by a contact trench 133 which is filled with a conductive material. The contact trench 133 contacts the first layer 129 adjacent to the second main surface 120 thereby enabling a contact to the second portion 113 of the semiconductor substrate 100. The source contact line 505 is electrically connected to the control circuit 500. As is clearly to be understood, the source contact line 505 may be implemented in an alternative manner. The contact trench 133 may be implemented in a similar manner as the source contact groove 119 or the drain contact groove 117.

The first gate electrode 210 and the second gate electrode 310 are disposed adjacent to the first main surface 110 of the semiconductor substrate. Accordingly, the first and the second gate electrodes 210, 310 are configured to control a horizontal current flow. The semiconductor substrate 100 may comprise a first layer 129 comprising the first portion 112 and the second portion 113 that may be doped at the same doping concentration and with the same doping type. For example, the first portion 112 and the second portion 113 may be doped with the first conductivity type, e.g. $p^+$-type. The semiconductor substrate 100 may additionally comprise a further substrate portion 114 of the first conductivity type at a lower doping concentration than the first and second substrate portions. The further substrate portion 114 may be disposed between the second substrate portion 113 and the drift zone 360 and the body region 320 of the second transistor 30. The semiconductor substrate 100 may further comprise a third substrate portion 216 between the first substrate portion 112 and the drift zone 260 and the body region 220 of the first transistor 20. The third substrate portion 216 may be of the second or first conductivity type. According to the embodiment shown in FIG. 4, the third substrate portion 216 is of the second conductivity type.

According to a further embodiment, the semiconductor device comprises a buried layer 215 of the second conductivity type between the first portion 112 of the substrate and the first body region 220 and the first drift zone 260 of the first transistor 20. According to this embodiment, the buried layer 215 is not disposed between the second portion 113 of the substrate and the second body region 320 and the second drift zone 360 of the second transistor.

According to the embodiment shown in FIG. 4, the first and the second body regions 220, 320 are of the first conductivity type, and the first and the second drift zones 260, 360 are of the second conductivity type. As is further illustrated in FIG. 4, the third substrate portion 216 may be disposed between the buried layer 215 and the first body region 220 and the first drift zone 260. Due to the presence of a pn junction comprising the buried layer 215, the first transistor 220 may be effectively insulated from the first substrate portion 112 and the second substrate portion 113 which are electrically connected with the first drain region 205 via the first drain contact.

As a consequence, it becomes possible to integrate two transistors on a common or joint semiconductor substrate 100 so that the first drain region 205 and the second source region 301 are electrically connected to a common terminal. For example, the two transistors may be of the same conductivity type. In particular, the two transistors are integrated in such a manner that the two transistors may be contacted from the first main surface 110 and the second main surface 120, respectively. At the same time the first transistor 20 is effectively insulated from the first drain region 205 and the second source region 301.

The drain conductive material 115 may be disposed in a drain contact groove 117 that is formed in the first main surface 110. The drain contact groove 117 may extend from the first main surface 110 through the buried layer 215 to the first substrate portion 112. The source conductive material 116 may be disposed in a source contact groove 119 that may be formed in the first main surface 110. The source contact groove 119 may extend to the second substrate portion 113. The second source region 301 may be formed at the sidewall 172 of the source contact groove 119. The first drain region 205 may be formed at the sidewall 118 of the drain contact groove 117. The semiconductor device may further comprise a source contact trench 203 for contacting the first source region 201. The source contact trench 203 may be filled with a source conductive material 115. The source contact trench 203 extends from the first main surface 110 into the semiconductor substrate, e.g. to a depth that at least corresponds to a depth of the first source region 201. The source contact groove 119 of the second transistor 30 extends to a deeper depth than the source contact trench 203.

The buried layer 215 of the second conductivity type may be doped at a high doping concentration. For example, the doping concentration may be higher than 1e19 $cm^{-3}$. According to further embodiments, the buried layer 215 may be doped at a lower doping concentration than indicated above. The buried layer 215 should not be depleted during transistor action in order to maintain the insulating properties. The buried layer 215 may be arranged at a vertical distance with respect to the components of the first transistor 20. For example, the buried semiconductor layer 215 may be disposed at a distance to the first body region 220 and at a distance to the first drift zone 260. The distance between the first body region 220 and the buried layer 215 should be adjusted in order to provide the desired insulating characteristics.

According to a further embodiment, as will be discussed with reference to FIG. 6A, the buried semiconductor layer 315 of the second conductivity type may be disposed between the second substrate portion 113 and the body region 320 and the drift zone 360 of the second transistor 30. According to this embodiment, the buried semiconductor layer 315 is not disposed between the first substrate portion 112 and the first body region 220 and the first drift zone 260.

According to the embodiment of FIG. 4, the drain conductive material 115 deeply extends into the semiconductor substrate, e.g. to the first portion 112 of the semiconductor substrate. Further, the source conductive material 116 may deeply extend into the semiconductor substrate, e.g. to the second portion 113 of the semiconductor substrate. As a consequence, a parasitic bipolar transistor may be deteriorated or suppressed. For example, the first layer 129 comprising the first portion 112 and the second portion 113 may be doped at a doping concentration of 1e19 $cm^{-3}$. As a consequence, the heavily doped portions 112, 113 suppress a transistor e.g. an npn transistor which could otherwise be formed in this region. A doped portion 121, 122 of the first conductivity type may be disposed between the drain conductive material 115 and the first portion 112 of the semiconductor substrate and between the source conductive material 116 and the second portion 113 of the semiconductor substrate.

The drain contact groove 117 and the source contact groove 119 may be formed in the semiconductor substrate 100 from the first main surface 110 so as to extend into the depth direction, e.g. the z direction of the substrate 100. The depth of the drain contact groove 117 and of the source contact groove 119 may be larger than a depth of the gate trench 212. The depth of the drain contact groove 117 and of the source contact groove 119 may be approximately 3 to 20 µm, e.g. 4 µm.

An insulating material 253 may be formed over the first main surface 110 of the semiconductor substrate so that the first drain region 205 is not electrically coupled to a conductive material disposed at the first main surface 110 of the semiconductor substrate. Likewise, the second source region 301 may be disconnected from a conductive element at the top surface of the semiconductor device.

According to the embodiment shown in FIG. 1, the first drain region 205 and the second source region 301 are electrically connected to a conductive layer 130 disposed on the second main surface 120 of the semiconductor substrate 100 by means of the first drain contact portion 206 that comprises a drain conductive material 115 in the drain contact groove 117 and the first portion 112 of the semiconductor substrate. Further, the second source region 301 is electrically connected to the conductive layer 130 disposed on the second main surface 120 of the semiconductor substrate 100 by means of the second source contact portion 302 that comprises a source conductive material 116 in the source contact groove 119 and the second portion 113 of the semiconductor substrate. As a result, the first drain contact and the second source contact implement a vertical contact to the backside of the semiconductor device 1 by means of a low resistive drain conductive material 115 and a low resistive source conductive material 116 which are filled in the drain contact groove 117 and the source contact groove 119, respectively. The drain conductive material 115 and the source conductive material 116 may comprise a metal such as tungsten. Further examples of the source conductive material 116 and the drain conductive material 115 comprise polysilicon. Examples of the materials of the metallization layer comprise metals such as tungsten, optionally including suitable intermediate layers.

As has been mentioned above, power transistors generally comprise a plurality of transistor cells that are connected parallel to each other. Each of the transistor cells may have the structure as described herein with reference to the Figures shown. For example, a plurality of parallel transistor cells may be arranged along the second direction, e.g. the y direction and may be connected in parallel to form a transistor. Further transistor cells of the transistor may be disposed in a mirrored manner with respect to the drain region and the source region. In the context of the present specification, the term "semiconductor device" may refer to the single transistors 20, 30, the transistors comprising a plurality of transistor cells.

The first gate electrode 210 is insulated from the first body region 220 by means of the first gate dielectric layer 211. Likewise, the second gate electrode 310 is insulated from the second body region 320 by means of the second gate dielectric layer 311. The first gate electrode 210 may be electrically connected to a first gate terminal 213. The second gate electrode 310 of the second transistor may be electrically connected to a second gate terminal 313. The first transistor and/or the second transistor 30 may further comprise a field plate 250, 350. According to an embodiment, the first or the second field plate 250, 350 may be implemented as a planar field plate that is disposed over the first main surface 110 of the semiconductor substrate. According to a further embodiment, the field plate may be arranged in a field plate trench 252, 352, that extends in the semiconductor substrate. The field plate 250, 350 may be insulated from the drift zones 260, 360 by means of a field dielectric layer 251, 351.

The semiconductor device shown in FIG. 4 further comprises a first and a second body contact portion 225, 325. The first body contact portion 225 electrically connects the first body region 220 with the first source contact 202. The second body contact portion 325 electrically couples the second body region 320 to the second source contact 302. The first and the second body contact portions 225, 325 are doped with a first conductivity type. Due to the presence of the body contact portions 225, 325, the suppression of a parasitic bipolar transistor may be improved. The body contact portion 225, 325 may be implemented as a horizontal body contact portion 225b, 325b which is disposed as a portion of a correspondingly doped layer between the first and/or second body regions 220,320. A vertical body contact portion 225a, 325a will be explained below with reference to FIGS. 5B and 5C.

As is further shown in FIG. 4, according to an embodiment, an avalanche clamping diode 107 may be formed adjacent to the second drain contact 306. In more detail, the second drain region 305 of the second conductivity type, and the further substrate portion 114 of the first conductivity type of the semiconductor substrate form a pn diode 107 which may cause an avalanche breakdown in case of a breakdown of the semiconductor device. Thereby, an avalanche breakdown in the drift region may be avoided, which might lead to a drift of the device parameters. Thus, the characteristics of the device are improved. By setting a thickness of the respectively doped portions and by setting a doping concentration of the doped portions, the breakdown voltage may be adjusted. Alternatively, a corresponding avalanche clamping diode may be formed adjacent to the first source region 201 and form a component of the first transistor 20.

In the following, the structure of the first and second transistors 20, 30 will be explained in more detail while referring to FIGS. 5A to 5E. As is to be appreciated, the first and the second transistors 20, 30 may be very similar in structure. The first and the second transistors 20, 30 particularly differ from each other due to the different structure of the respective source and drain contacts. The first and the second transistors 20, 30 will be explained by explaining the structure of the second transistor 30.

Figure 5A:
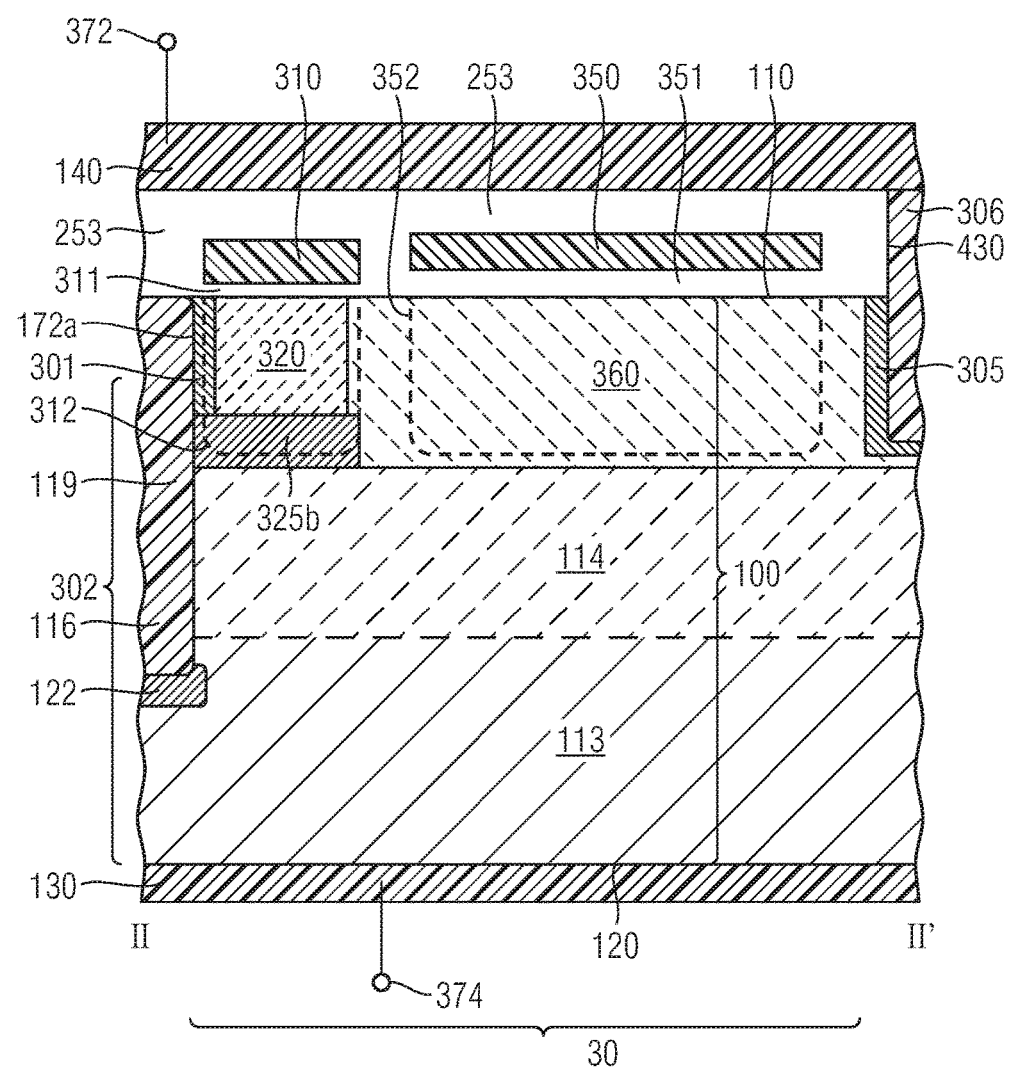
FIGS. 5A and 5B show cross-sectional views of a transistor illustrated in FIG. 1.

FIG. 5A shows an enlarged view of components of the second transistor 30. The first and the second transistors 20, 30 may comprise a horizontal body contact portion 225b, 325b. Moreover, the first and the second transistors 20, 30 may further comprise a vertical body contact portion 225a, 325a. For example, the source contact trench (illustrated in FIG. 4) 203 may comprise a sidewall 171 having first and second sidewall portions 171a, 171b. The vertical body contact portions 225a may disposed adjacent to the second sidewall portions 171b, and the first source region 201 may be disposed adjacent to the first sidewall portions. In a similar manner, the source contact groove 119 comprises first sidewall portions 172a and second sidewall portions 172b. As is illustrated in FIG. 5A, the second source region 301 of the second transistor 30 is disposed adjacent to the first sidewall portion 172a.

Figure 5B:
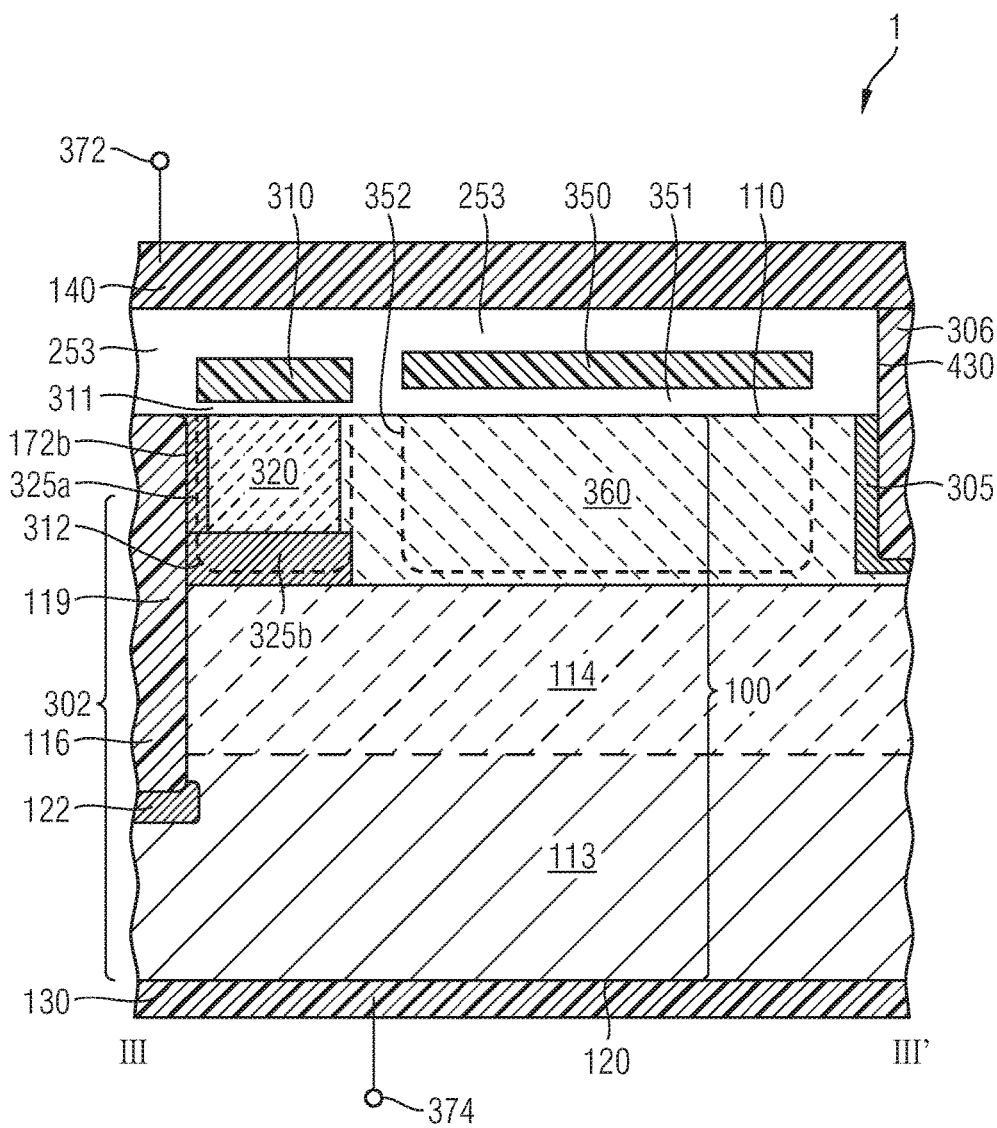
Figure 5C:
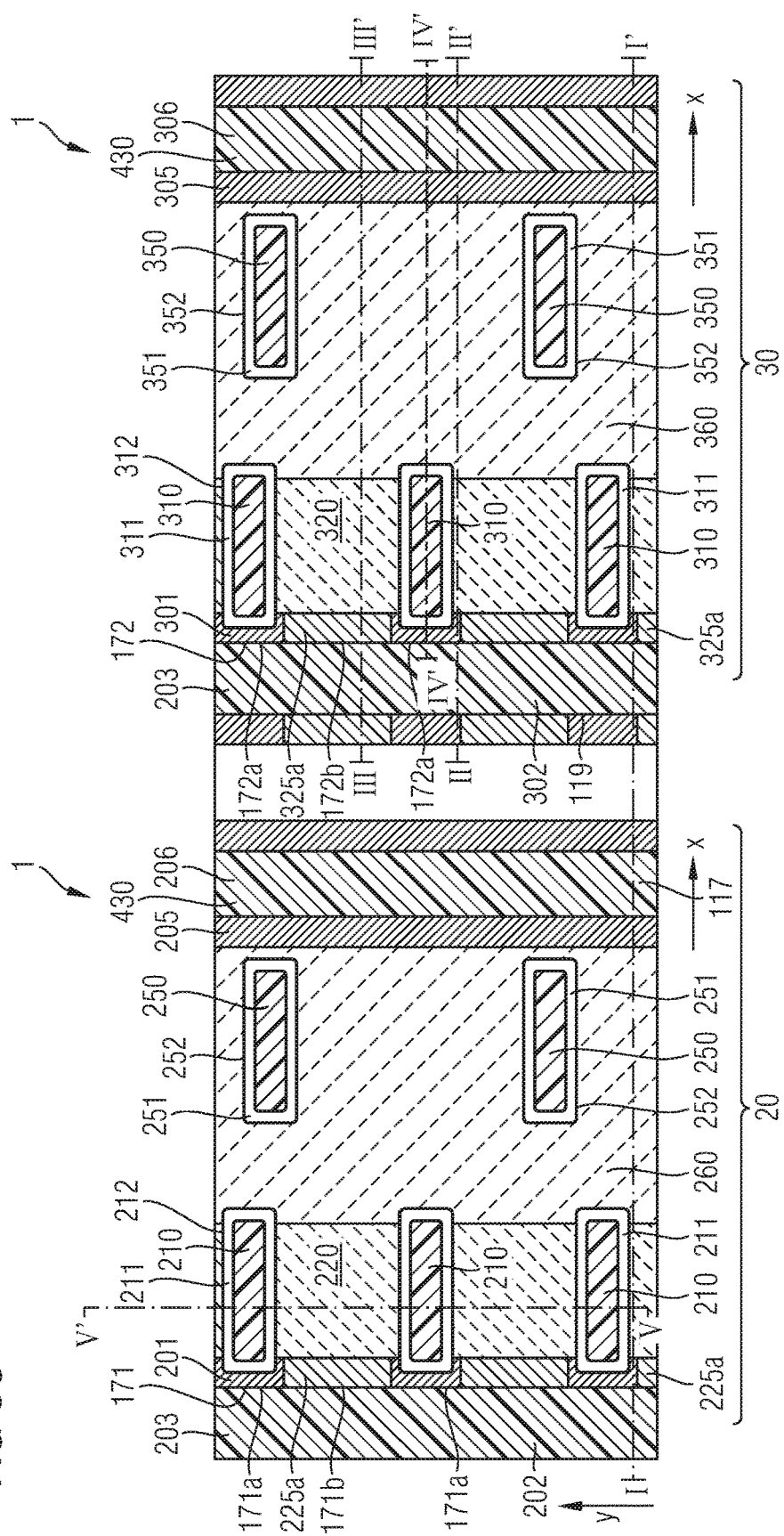
FIG. 5C shows a horizontal cross-sectional view of the semiconductor device shown in FIG. 1.

FIG. 5B shows a cross-sectional view of the second transistor shown in FIG. 4, the cross-sectional view being taken at a position which is shifted along a second direction perpendicular to the first direction. The cross-sectional view of FIG. 5B is taken between III and III', as is also illustrated in FIG. 5C. The cross-sectional view of FIG. 5B is taken so as to intersect a second portion 172b of the sidewall 172 of the source contact groove 119. Differing from the cross-sectional view shown in FIG. 5A, a vertical body contact portion 325a is formed adjacent to or in the second portion 172b of the sidewall of the source contact groove 119. Accordingly, the vertical body contact portion 325a vertically overlaps with the second source region 301. The wording "vertically overlaps with" is intended to mean that the respective portions or regions may extend in the same depth. In more detail, there may be a vertical extension of the semiconductor body at which the respective portions or regions may be present. To be more specific, the starting points of the respective portions or regions do not need to coincide. Further, the end points of the respective portions or regions do not need to coincide. The second body contact portion 325 is electrically connected to the second source contact. In a similar manner, the first body contact portion 225 is electrically connected to the first source contact.

Due to the presence of the body contact portion 225, 325 and, in particular due to the feature that the vertical body contact portion 225a, 325a vertically overlaps with the first source region 201 and the second source region 301, respectively, the suppression of a parasitic bipolar transistor may be improved. In more detail, holes may be efficiently removed from the body region, thereby preventing detrimental effects such as a snap-back effect. This results in an improved safe-operating area (SOA) that corresponds to a region in the I-V-characteristic in which the semiconductor device may be safely operated.

FIG. 5C shows a horizontal cross-sectional view of the semiconductor device illustrated in FIG. 1. As is shown, the semiconductor device 1 comprises a source contact trench 203, a source contact groove 119, a drain contact groove 117 and a drain contact trench 430. The source contact groove 119 and the drain contact groove 117 extend in a second direction (e.g. the y direction) which is perpendicular to the first direction. Any of the grooves and trenches need not have strictly vertical sidewalls. In more detail, the sidewalls may also be inclined or rounded. For example, any of the grooves and trenches may be tapered.

The semiconductor device further comprises first gate trenches 212 and second gate trenches 312 that are formed in the first main surface 110 of the semiconductor device. The semiconductor device further may comprise first and second field plate trenches 252, 352. A longitudinal axis of the gate trenches 212 and the field plate trenches 252 may extend in the first direction. The term "longitudinal axis" refers to a horizontal axis along which the respective trench has a greater extension length than in another horizontal direction. The first gate trenches 212 pattern the first body region 220 into a plurality of segments, e.g. ridges or fins. In a similar manner, the second gate trenches 312 pattern the second body region 320 into a plurality of segments, e.g. ridges or fins. Accordingly, as will be explained later in more detail, the first and the second transistors may be implemented as FinFETs.

The sidewall 171 of the first source contact groove 119 may be segmented into first portions 171a and second portions 171b. The first source region 201 may be disposed adjacent to or in first portions 171a of the sidewall. Further, the first vertical body contact port on 225a may be disposed adjacent to or in second portions 171b of the sidewall 171. The distance between adjacent gate trenches 212, 312 may be different from a distance between adjacent field plate trenches 252, 352. A portion of the gate electrode 210, 310 may be disposed over the first main surface 110 of the semiconductor substrate and may extend in the second direction. Further, a portion of the field plate 250, 350 may be disposed over the first main surface 110 of the semiconductor substrate and may extend in the second direction. According to an embodiment, the first gate trenches 212 and the second gate trenches 312 may be disposed at the same position or at a different position which may, e.g. be measured along the second direction.

Figure 5D:
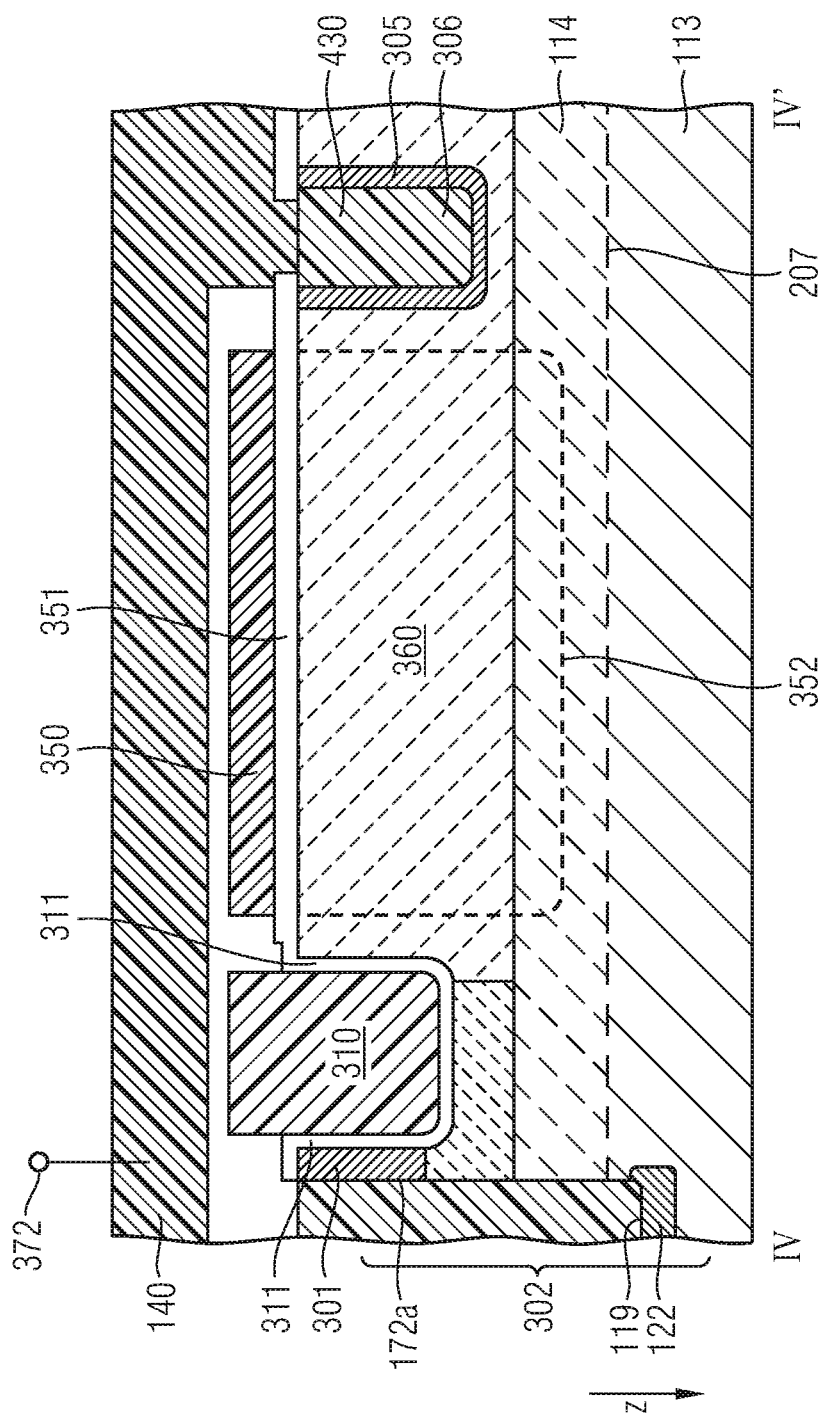
FIGS. 5D and 5E show cross-sectional views of a portion of the semiconductor device shown in FIGS. 1A and 4.

FIG. 5D shows a cross-sectional view of the transistor shown in FIGS. 5A to 5C, the cross-sectional view being taken at a position so as to intersect the second gate trenches 312. The cross-sectional view of FIG. 5D is taken between IV and IV', as is also illustrated in FIG. 5C. The cross-sectional view of FIG. 5D shows the same components as FIGS. 5A and 5B. Further, the second gate trench 312 extends in the semiconductor substrate 100 in the depth direction, e.g. the z direction. FIG. 5D further shows modifications of the embodiment illustrated in FIGS. 5A to 5C. Differing from the structures shown in FIGS. 5A to 5C, the second field plate trench 352 (indicated by broken lines and being disposed before and behind the depicted plane of the drawing) may extend to the further portion 114 of the semiconductor substrate. For example, the second field plate trench 352 may extend to a depth that is deeper than the depth of the second drift zone 360. As a result, the second field plate 350 may vertically overlap with the further portion 114 of the semiconductor substrate.

According to a further modification, that may be independent from the depth of the field plate trench 252, 352 the drain contact trench 430 may extend to the further portion 114 of the semiconductor substrate. As a result, the second drain contact 306 may vertically overlap with the further portion 114 of the semiconductor substrate having the first conductivity type. For example, a semiconductor portion of the second conductivity type may be disposed adjacent to the second drain contact 306.

Figure 5E:
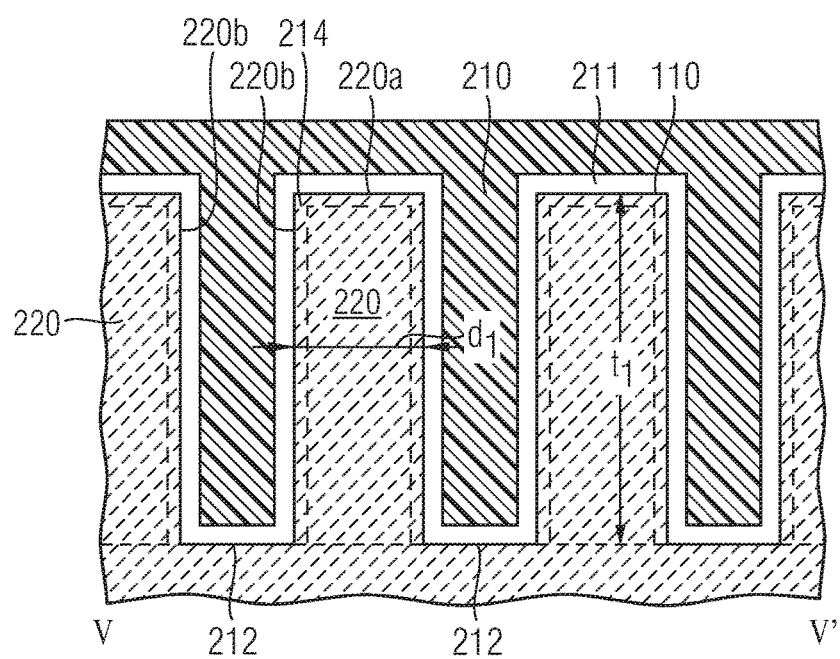

FIG. 5E shows a cross-sectional view which is taken along the second direction. The cross-sectional view of FIG. 5E is taken between V and V' as is illustrated in FIG. 5C so as to intersect a plurality of first gate trenches 212. As is to be clearly understood, the second gate trenches 312 may have the same shape, and a detailed description thereof is omitted. The first body region 220 forming the single ridges or fins may be patterned by adjacent first gate trenches 212. The ridges comprise a top surface 220a and sidewalls 220b. A first gate dielectric layer 211 is disposed adjacent to the sidewalls 220b and the top surface 220a of each of the ridges. A conductive material is filled in the trenches 212 between adjacent ridges to form the first gate electrode 210. As a result, the first body region 220 has the shape of a ridge extending in the first direction. Differently stated, a longitudinal axis of the ridges or the fins corresponds to the first direction.

The sidewalls 220b may extend perpendicularly or at an angle of more than 75° with respect to the first main surface 110. The first gate electrode 210 may be disposed adjacent to at least two sides of the ridge.

When the transistor is switched on, e.g. by applying as suitable voltage to the first gate electrode 210, a conductive inversion layer 214 (conductive channel) is formed at the boundary between the first body region 220 and the first gate dielectric layer 211. Accordingly, the field effect transistor is in a conducting state from the first source region 201 to the first drain region 205. In case of switching off, no conductive inversion layer is formed and the transistor is in a non-conducting state. According to an embodiment, the conductive channel regions 214 formed at opposing sidewalls 220b of a ridge do not merge with each other so that the first body region 220 may not be fully depleted and may be connected to the first source region and to the vertical body contact portion 225a.

For example, a distance between adjacent first gate trenches 212 that corresponds to a width d1 of the ridges may be larger than 200 nm, e.g. 200 to 2000 nm, for example, 400 to 600 nm. The transistor may further comprise a field plate. When the transistor is switched off, e.g. by applying a corresponding voltage to the gate electrode, carriers may be depleted from the drift zone. As a result, a doping concentration of the drift zone may be increased while maintaining the blocking capability of the transistor. As a result, the on-state resistance may be further reduced, while securing the high voltage blocking capability.

According to a further embodiment, the width d1 of the first body region 220 fulfils the following relationship: $d1 \leq 2*l_d$, wherein $l_d$ denotes a length of a depletion zone which is formed at the interface between the first gate dielectric layer 211 and the first body region 220. For example, the width of the depletion zone may be determined as:

$$l_d = \sqrt{\frac{4\varepsilon_s kT \ln(N_A/n_i)}{q^2 N_A}}. \qquad a$$

wherein $\varepsilon_s$ denotes the permittivity of the semiconductor material (11.9×$\varepsilon_0$ for silicon, $\varepsilon_0$=8.85×10$^{-14}$ F/cm), k denotes the Boltzmann constant (1.38066×10$^{-23}$ J/k), T denotes the temperature (e.g. 300 K), in the denotes the natural logarithm, $N_A$ denotes the impurity concentration of the semiconductor body, $n_i$ denotes the intrinsic carrier concentration ($1.45 \times 10^{10}$ cm$^{-3}$ for silicon at 27° C.), and g denotes the elementary charge ($1.6 \times 10^{-19}$ C).

Generally, the length of the depletion zone varies depending from the gate voltage. It is assumed that in a transistor the length of the depletion zone at a gate voltage corresponding to the threshold voltage corresponds to the maximum width of the depletion zone. For example, the width of the first ridges may be approximately 10 to 200 nm, for example, 20 to 60 nm along the main surface 110 of the semiconductor substrate 100.

According to the embodiment in which the width d1≤2*ld, the transistor is a so-called "fully-depleted" transistor in which the first body region 220 is fully depleted when the first gate electrode 210 is set to an on-voltage. In such a transistor, an optimal sub-threshold voltage may be achieved and short channel effects may be efficiently suppressed, which may result in improved device characteristics.

In the field effect transistors 20, 30 illustrated in FIGS. 5A to 5E, the first and second gate electrodes 210, 310 are disposed in gate trenches 212, 312 in the first main surface 110, to form FinFETs. The source regions 201, 301 vertically extend into the semiconductor substrate 100, and the drain regions 205, 305 vertically extend in the semiconductor substrate 100. As a result, the effective channel width and the volume of the drain extension of the transistor may be largely increased, thereby reducing the on-state resistance. Due to the specific implementation of the first drain contact portion and the second source contact portion each extending to the second main surface of the semiconductor substrate, the properties of the vertically extending source and drain regions may be further utilized.

The semiconductor device 1 illustrated with reference to FIGS. 4 and 5A to 5E comprises a first transistor 20 comprising a plurality of single first transistor cells which may be connected in parallel and second transistor 30 comprising a plurality of single second transistor cells. The first transistor cells may be connected in parallel. The second transistor cells may be connected in parallel. The pattern of the first and second transistor cells 20, 30 may be repeated and mirrored along the first and the second directions. The first drain regions of parallel first transistor cells and the second source regions of parallel second transistor cells may be connected to the conductive layer 130 (e.g. a common back side metallization layer) which is formed adjacent to the second main surface 120 of the semiconductor substrate 100. The first source regions of parallel first transistor cells may be connected to the first front side conductive layer 135 that is disposed on a side of the first main surface 110 of the semiconductor substrate 100. Further, the second drain portions of adjacent second transistor cells may be connected to second front side conductive layer 140 that is disposed on a side of the first main surface 110 of the semiconductor substrate 100. Accordingly, no specific patterning of the metallization layer is necessary for contacting transistor cells of the single transistors. As a result, the manufacturing process may be further simplified and cost may be reduced. The first gate electrode 210 may be electrically connected to a first gate terminal 213, and the second gate electrode 310 may be electrically connected to a second gate terminal 313. The field plate 250 may be, e.g. connected to the first source terminal 272. The second field plate 350 may be, e.g. connected to the output terminal 374.

Figure 6A:
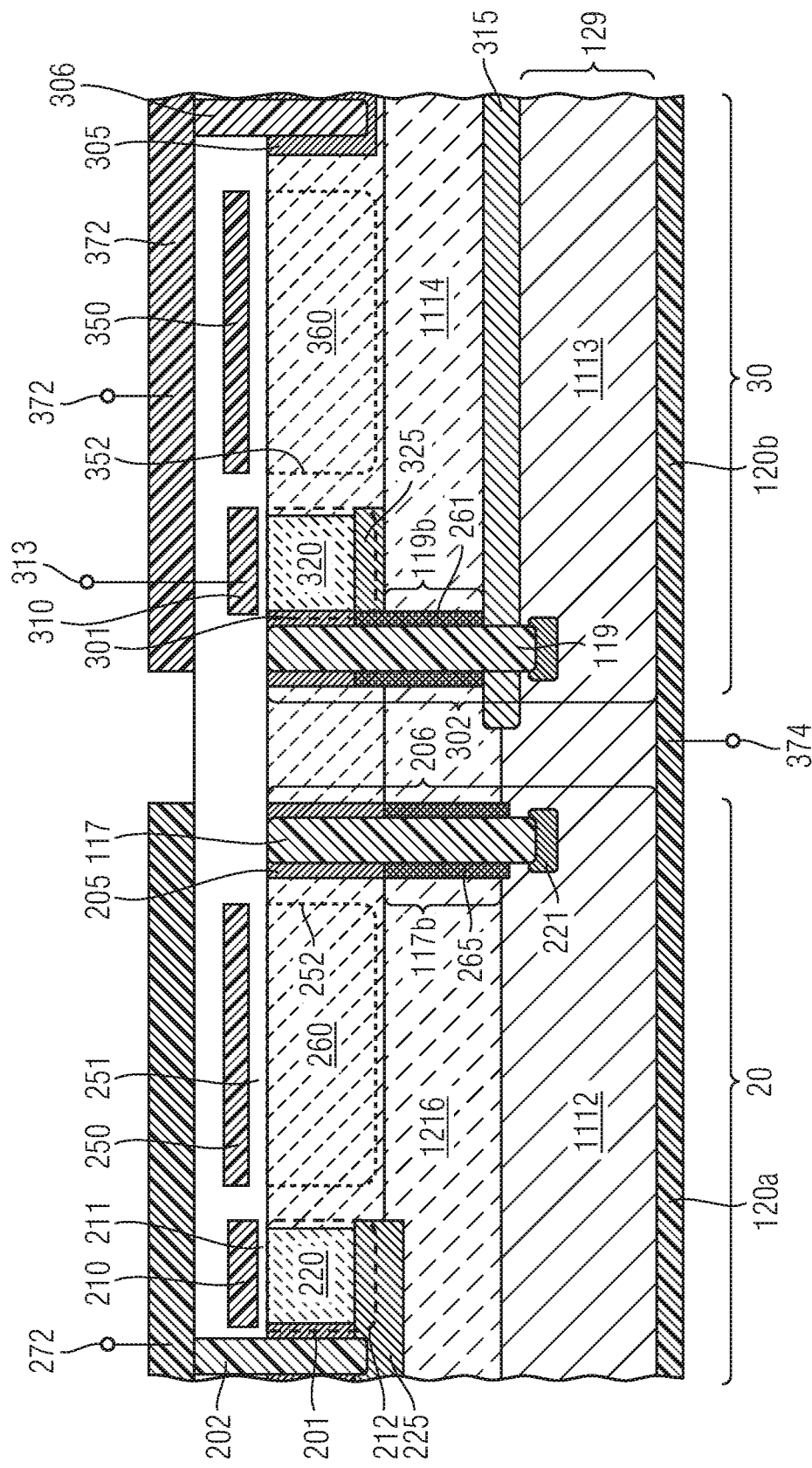
FIGS. 6A and 6B show cross-sectional views of a semiconductor device according to further embodiments, respectively.

FIG. 6A shows a cross-sectional views of a semiconductor device according to a further embodiment. Differing from the embodiment shown in FIG. 4, the first and second body regions 220, 320 now are of the second conductivity type, whereas the first substrate portico 1112 and the second substrate portion 1113 are of the first conductivity type. For example, the first and second substrate portions 1112, 1113 may be of n$^+$-conductivity type, whereas the body region may be of the p conductivity type. According to this embodiment, a buried layer 315 of the second conductivity type is disposed between the second substrate portion 1113 and the components of the second transistor 30. For example, the buried layer 315 of the second conductivity type may be of p$^+$ type conductivity. As a consequence, the second drain region 305 is effectively insulated from the first layer 129 that is electrically connected with the first drain region 205 and the second source region 301. The buried layer 315 is not disposed between the first substrate portion 1112 and the components of the first transistor 20. The third substrate portion 1216 and the further substrate portion 1114 may be of the first conductivity type, at a lower doping concentration than the first substrate portion 1112 and the second substrate portion 1113. The buried layer 315 may be disposed between the second substrate portion 1113 and the further substrate portion 1114.

According to the embodiment shown in FIG. 6A, a semiconductor substrate portion adjacent to the source conductive material 116 or the drain conductive material 115 is doped with the second conductivity type. For example, the corresponding dopants may be introduced via the sidewalls of the drain contact groove 117 or the source contact groove 119. The dopants may be of the second conductivity type so as to efficiently insulate the source conductive material 116 and the drain conductive material 115 from the adjacent substrate portions. According to the embodiment shown in FIG. 6A, the doped portion 265 is disposed adjacent to a lower part 117b of the drain contact groove 117. Further, the doped portion 261 is disposed adjacent to a lower part 119b of the source contact groove 119.

According to the embodiment shown in FIG. 6A, the first and second transistors 20, 30 may be formed in a substrate having a conductivity type that is different from the conductivity type of the body region 220, 320.

Figure 6B:
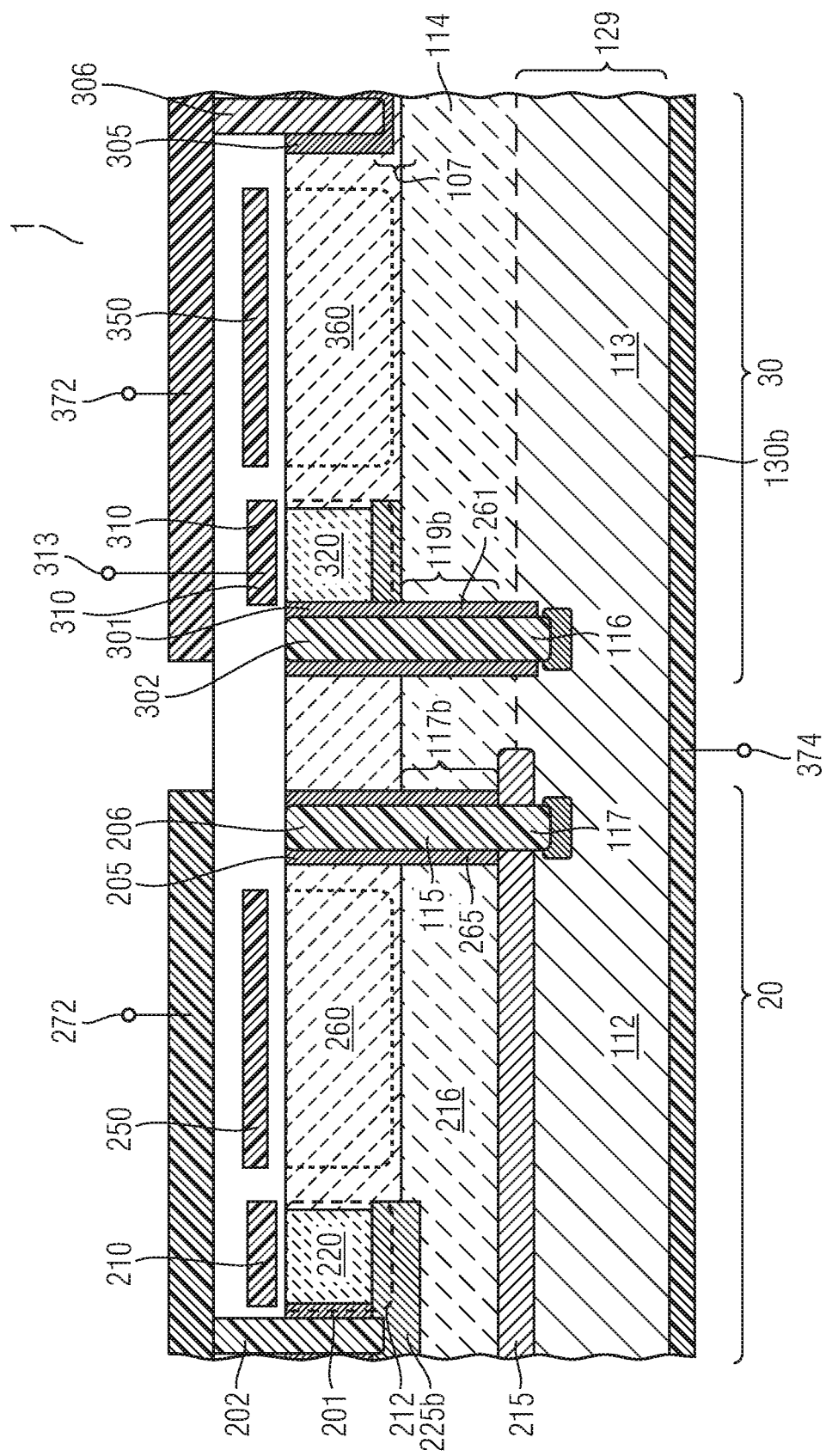

FIG. 6B shows a further embodiment according to which the third substrate portion 216 in contact with the first transistor 20 is of the first conductivity type. Further, the body regions 220, 320 are of the first conductivity type. As a result, the drift zone 260 of the first transistor 20 is adjacent to a semiconductor layer of the first conductivity type. The embodiment illustrated in FIG. 6B is very similar to the embodiment shown in FIG. 4 so that a detailed description thereof will be omitted. In particular, the semiconductor device 1 of FIG. 6B comprises a buried layer 215 of the second conductivity type between the first layer 129 and the first transistor 20. The buried layer 215 is not disposed between the first layer 129 and the second transistor 30. Differing from the embodiment shown in FIG. 4, the semiconductor device comprises a third substrate portion 216 of the first conductivity type adjacent to components of the first transistor 20. According to this embodiment, a doped portion 265 of the second conductivity type is disposed adjacent to the sidewalls of the lower part 117b of the drain contact groove 117 so as to provide an insulation between the drain conductive material 115 and the third substrate portion 216. Further, a doped portion 261 of the second conductivity type is disposed adjacent to sidewalls of the lower part 119b of the second source contact groove 119 so as to provide an electrical insulation between the source conductive material 116 and the further substrate portion 114.

As has been explained above, due to the presence of the semiconductor layer of the second conductivity type exclusively between the first substrate portion 112 and the first transistor 20 or exclusively between the second substrate portion 113 and the second transistor 30, each of the first and second transistors 20, 30 may be disposed over a substrate portion which is suitably doped for achieving insulation between source and drain region of the respective transistor.

The buried layer 215, 315 may be formed in an easy manner. For example, the buried layer 215 may be formed by an ion implantation step in which those portions of the semiconductor substrate, which are not to be implanted, are masked by a suitable masking layer. Thereafter, further steps are performed in order to manufacture the further components of the transistors. In particular, epitaxial processes are performed in order to manufacture further layers of the substrate in which the components of the transistors are to be formed. According to a further embodiment, the semiconductor layer may be formed by a diffusion process, e.g. from a phosphorous doped or arsenic doped glass. The doped portions 265, 261 may be formed by diffusion from boron glass disposed in the source contact groove or in the drain contact groove. According to a further embodiment, the dopants may be diffused from a boron containing gas phase.

The semiconductor device described herein, enables the monolithic formation of a half bridge circuit. In more detail, the first and the second transistors 20, 30 are disposed in a single semiconductor substrate 100. Due to the special structure in which the first source terminal and the second drain terminal are disposed adjacent to a first main surface 110 of the semiconductor substrate, whereas the first drain region is electrically connected to the second source region and may be contacted from a second main surface of the semiconductor substrate, a vertical semiconductor device is implemented. In particular, a vertical semiconductor device comprising two lateral transistors is implemented. In a lateral transistor a current flow parallel to the first main surface of the substrate is accomplished. For example, the source regions and the drain regions may be disposed adjacent to the first main surface. Further, the gate electrodes may have a longitudinal axis parallel to the first main surface. The respective source and drain regions may be contacted by means of a front side conductive layer and a back side conductive layer so that the half bridge may be contacted in an easy manner at a low resistance.

As is readily to be appreciated, the concept illustrated in FIG. 4 may also be applied to a planar transistor which optionally may comprise a drift zone. Accordingly, an electric circuit 10 may include a semiconductor device 1. The semiconductor device 1 may comprise a first transistor 20 and a second transistor 30 in a semiconductor substrate 100 having a first main surface 110, the first transistor 20 and the second transistor 30 being of the same conductivity type. The first transistor 20 may comprise a first source region 201 adjacent to the first main surface, a first drain region 205, and a first drain contact portion 206 electrically connected to the first drain region 205. The second transistor 30 comprises a second source region 301 and a second drain region 305 adjacent to the first main surface 110. The second transistor 30 further comprises a first source contact portion 302 electrically connected to the second source region 301. The semiconductor substrate further comprises a first semiconductor layer 129 of a first conductivity type. The first drain contact portion 206 and the first source contact portion 302 electrically connected to the first semiconductor layer 129. The semiconductor substrate 100 further comprises a buried layer 215, 315 of a second conductivity type. The buried layer 215 is disposed between the first transistor 20 and the first semiconductor layer 129 and is not disposed between the second transistor 30 and the first semiconductor layer. Alternatively, the buried layer 315 is disposed between the second transistor 30 and the first semiconductor layer 129 and is not disposed between the first transistor 20 and the first semiconductor layer. The electric circuit 10 further includes a control circuit 500.

The first semiconductor layer 129 may be disposed adjacent to a second main surface 120 of the semiconductor substrate 100 so that the first semiconductor layer 129 is disposed between the second main surface 120 and the buried layer 215, 315.

While embodiments of the invention have been described above, it is obvious that further embodiments may be implemented. For example, further embodiments may comprise any subcombination of features recited in the claims or any subcombination of elements described in the examples given above. Accordingly, this spirit and scope of the appended claim should not be limited to the description of the embodiments contained herein.

What is claimed is:

1. An electric circuit including a semiconductor device, the semiconductor device comprising:
   a first transistor and a second transistor in a common semiconductor substrate, the first transistor being of the same conductivity type as the second transistor;
   a first source region of the first transistor electrically connected to a first source terminal via a first main surface of the common semiconductor substrate;
   a second drain region of the second transistor electrically connected to a second drain terminal via the first main surface of the common semiconductor substrate; and
   a first drain region of the first transistor and a second source region of the second transistor electrically connected to an output terminal via a second main surface of the common semiconductor substrate,
   wherein the electric circuit further comprises a control circuit operable to control a first gate electrode of the first transistor and a second gate electrode of the second transistor,
   wherein the first transistor further comprises a first body region and a first drift zone, the first body region and the first drift zone being arranged in a direction parallel to the first main surface,
   wherein the second transistor further comprises a second body region and a second drift zone, the second body region and the second drift zone being arranged in the direction parallel to the first main surface.

2. The electric circuit of claim 1, wherein the first source region, the first drain region, the second source region and the second drain region are disposed directly adjacent to the first main surface of the common semiconductor substrate.

3. The electric circuit of claim 1, wherein:
   the first transistor further comprises a first drain contact electrically connected to the first drain region, the first drain contact comprising a first drain contact portion and a second drain contact portion;
   the first drain contact portion comprises a drain conductive material in direct contact with the first drain region, the first drain contact portion further comprising a first portion of the common semiconductor substrate between the drain conductive material and the second drain contact portion;
   the second transistor further comprises a second source contact electrically connected to the second source region, the second source contact comprising a first source contact portion and a second source contact portion; and the first source contact portion comprises a source conductive material in direct contact with the second source region, the first source contact portion further comprising a second portion of the common semiconductor substrate arranged between the source conductive material and the second source contact portion.

4. The electric circuit of claim 3, wherein the second source contact portion and the second drain contact portion are implemented by a conductive layer disposed in contact with the second main surface.

5. The electric circuit of claim 3, further comprising a source contact line arranged in a contact trench electrically connecting the second portion of the common semiconductor substrate and the control circuit.

6. The electric circuit of claim 1, wherein the common semiconductor substrate and the control circuit are mounted to a common carrier.

7. The electric circuit of claim 6, wherein the control circuit is disposed over the common semiconductor substrate.

8. The electric circuit of claim 1, wherein the control circuit is electrically connected to the first source terminal and the second drain terminal.

9. An electric circuit including a semiconductor device, the semiconductor device comprising a first transistor and a second transistor in a common semiconductor substrate having a first main surface, the first and the second transistors being of the same conductivity type,
wherein the first transistor comprises a first source region adjacent to the first main surface and a first drain contact portion electrically connected to a first drain region;
wherein the second transistor comprises a second drain region adjacent to the first main surface and a first source contact portion electrically connected to a second source region,
wherein the common semiconductor substrate further comprises a first semiconductor layer of a first conductivity type, the first drain contact portion and the first source contact portion being electrically connected to the first semiconductor layer, and a buried layer of a second conductivity type between the first transistor and the first semiconductor layer,
wherein the buried layer is absent from a region between the first semiconductor layer and the second transistor, or a buried layer of the second conductivity type between the first semiconductor layer and the second transistor,
wherein the buried layer is absent from a region between the first semiconductor layer and the first transistor,
wherein the electric circuit further comprises a control circuit operable to control a first gate electrode of the first transistor and a second gate electrode of the second transistor.

10. The electric circuit of claim 9, wherein the first semiconductor layer is disposed adjacent to a second main surface of the common semiconductor substrate so that the first semiconductor layer is disposed between the second main surface and the buried layer.

11. The electric circuit of claim 9, wherein the first drain contact portion extends through the buried layer.

12. The electric circuit of claim 9, wherein the first and the second source regions and the first and the second drain regions are of the second conductivity type.

13. The electric circuit of claim 9, wherein the first and the second source regions and the first and the second drain regions are of the first conductivity type.

14. The electric circuit of claim 10, further comprising a conductive layer in contact with the second main surface, the first semiconductor layer being electrically connected with the conductive layer.

15. The electric circuit of claim 9, wherein:
the first transistor further comprises a first body region and a first drift zone along a direction parallel to the first main surface between the first source region and the first drain region; and
the second transistor further comprises a second body region and a second drift zone along the direction parallel to the first main surface between the second source region and the second drain region.

16. The electric circuit of claim 15, wherein:
the first transistor further comprises a first gate electrode in a first gate trench in the first main surface adjacent to the first body region; and
the second transistor further comprises a second gate electrode in a second gate trench in the first main surface adjacent to the second body region.

17. The electric circuit of claim 9, wherein source conductive material of the first source contact portion is disposed in a source contact groove formed in the first main surface.

18. The electric circuit of claim 9, wherein drain conductive material of the first drain contact portion is disposed in a drain contact groove formed in the first main surface.

19. The electric circuit of claim 14, further comprising a load electrically connected with the conductive layer.

20. An electric circuit including a semiconductor device, the semiconductor device comprising:
a first transistor and a second transistor in a common semiconductor substrate, the first transistor being of the same conductivity type as the second transistor;
a first source region of the first transistor electrically connected to a first source terminal via a first main surface of the common semiconductor substrate;
a second drain region of the second transistor electrically connected to a second drain terminal via the first main surface of the common semiconductor substrate; and
a first drain region of the first transistor and a second source region of the second transistor electrically connected to an output terminal via a second main surface of the common semiconductor substrate,
wherein the electric circuit further comprises a control circuit operable to control a first gate electrode of the first transistor and a second gate electrode of the second transistor,
wherein the first transistor further comprises a first drain contact electrically connected to the first drain region, the first drain contact comprising a first drain contact portion and a second drain contact portion,
wherein the first drain contact portion comprises a drain conductive material in direct contact with the first drain region, the first drain contact portion further comprising a first portion of the common semiconductor substrate between the drain conductive material and the second drain contact portion,
wherein the second transistor further comprises a second source contact electrically connected to the second source region, the second source contact comprising a first source contact portion and a second source contact portion,
wherein the first source contact portion comprises a source conductive material in direct contact with the second source region, the first source contact portion further comprising a second portion of the common semiconductor substrate arranged between the source conductive material and the second source contact portion.

21. The electric circuit of claim 20, wherein the second source contact portion and the second drain contact portion are implemented by a conductive layer disposed in contact with the second main surface.

22. The electric circuit of claim 20, further comprising a source contact line arranged in a contact trench electrically connecting the second portion of the common semiconductor substrate and the control circuit.

\* \* \* \* \*